United States Patent
Baldwin et al.

[11] Patent Number: 5,973,594
[45] Date of Patent: Oct. 26, 1999

[54] MULTIPLE OPTICAL DESIGNS FOR A MULTIFUNCTION SENSOR

[75] Inventors: John R. Baldwin, Newtown; Thomas J. Batko, Wallingford; David F. Ellison, Westport, all of Conn.

[73] Assignee: Hubbell Incorporated, Orange, Conn.

[21] Appl. No.: 08/736,864

[22] Filed: Oct. 25, 1996

Related U.S. Application Data

[63] Continuation-in-part of application No. 08/412,502, Mar. 29, 1995, Pat. No. 5,699,243, and application No. 08/705,778, Aug. 30, 1996, Pat. No. 5,772,326.

[51] Int. Cl.$^6$ .................................................. G08B 29/00
[52] U.S. Cl. ...................... 340/506; 340/511; 340/541; 340/565; 340/555; 359/642
[58] Field of Search ...................... 340/506, 511, 340/517, 521, 522, 531, 541, 555, 565, 567, 578, 600; 359/642, 722; 250/339.01, 339.02

[56] References Cited

U.S. PATENT DOCUMENTS

| | | | |
|---|---|---|---|
| 4,672,206 | 6/1987 | Suzuki et al. | 250/342 |
| 4,902,887 | 2/1990 | Everett, Jr. | 250/221 |
| 5,106,325 | 4/1992 | Robinson et al. | 439/540 |
| 5,115,967 | 5/1992 | Wdekind | 236/46 R |
| 5,266,807 | 11/1993 | Neiger | 250/353 |
| 5,290,175 | 3/1994 | Robinson et al. | 439/540 |
| 5,349,330 | 9/1994 | Diong et al. | 340/567 |
| 5,395,042 | 3/1995 | Riley et al. | 236/46 R |
| 5,479,812 | 1/1996 | Juntunen et al. | 73/3 |
| 5,489,891 | 2/1996 | Diong et al. | 340/567 |
| 5,509,108 | 4/1996 | Yeh | 395/114 |
| 5,525,846 | 6/1996 | Newell et al. | 307/125 |
| 5,640,143 | 6/1997 | Myron et al. | 340/541 |
| 5,739,523 | 4/1998 | Tsutsumi et al. | 250/221 |
| 5,739,753 | 4/1998 | Porter | 340/555 |
| 5,748,081 | 5/1998 | Lin | 340/555 |

FOREIGN PATENT DOCUMENTS

| | | |
|---|---|---|
| 0 177 130 | 4/1986 | European Pat. Off. . |
| 0 608 552 A1 | 8/1994 | European Pat. Off. . |
| 0 666 551 A1 | 8/1995 | European Pat. Off. . |
| 2 266 799 | 11/1993 | United Kingdom . |

*Primary Examiner*—Jeffery A. Hofsass
*Assistant Examiner*—Daryl C. Pope
*Attorney, Agent, or Firm*—Jerry M. Presson; William C. Roch

[57] ABSTRACT

A universal multifunction sensor having multiple optical designs and providing a plurality of parameter sensors in one sensor module which can interface with and control operation of one or more processor control systems in an occupied space networked environment. The universal multifunction sensor comprises a passive infrared occupancy sensor and an ambient light sensor. A common network communications and control processor coupled to a common communication transceiver are shared in common by the occupancy sensor and the ambient light sensor, such that the multifunction sensor can interface with and control operation of one or more processor control systems in an occupied space networked environment. A segmented lens array comprises a plurality of lens segments forming a lens array for directing infrared radiation onto the passive infrared occupancy sensor, a cubicle wall mount lens array providing a wide field of view and a very short range detection optical pattern; whereby the universal multifunction sensor can be provided with a segmented lens array designed to optimize the field of view and motion detection for a particular mounting application.

12 Claims, 7 Drawing Sheets

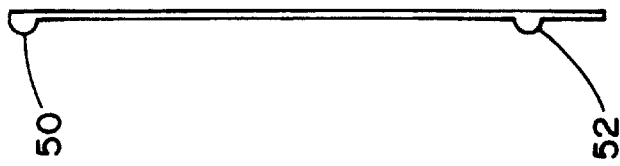
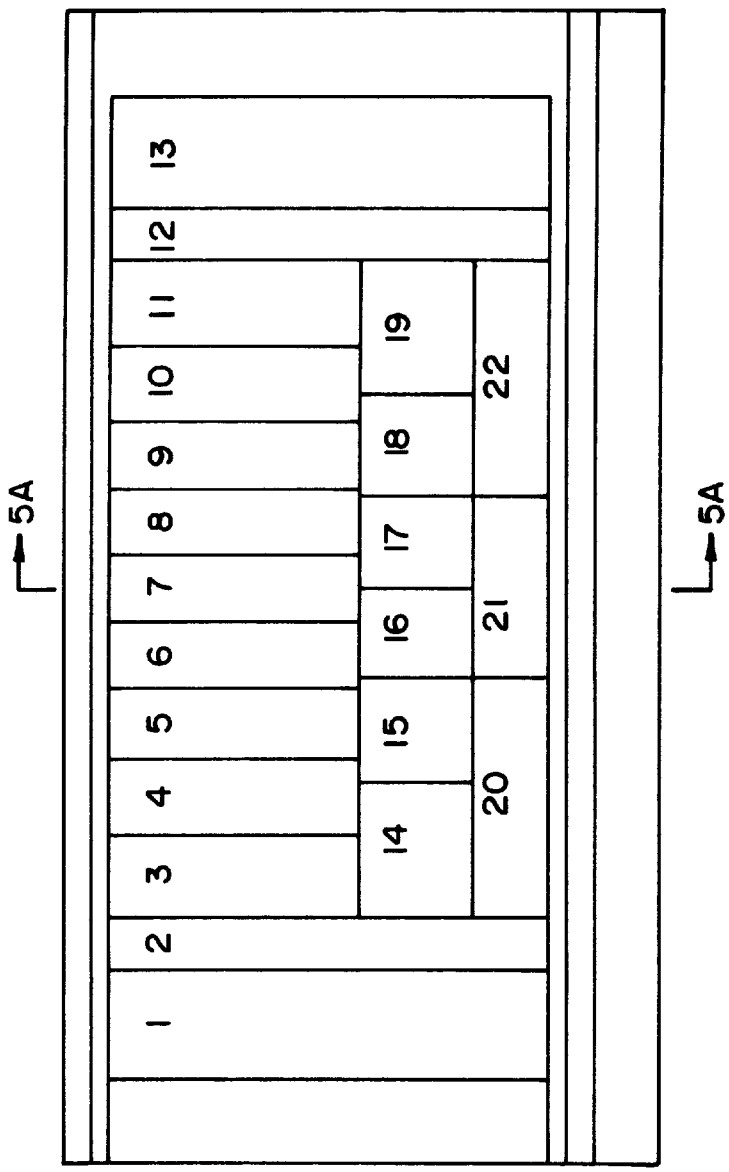
FIG.5A
FIG.5

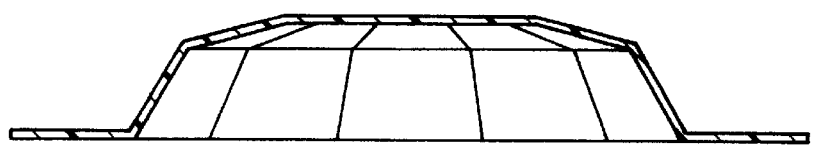
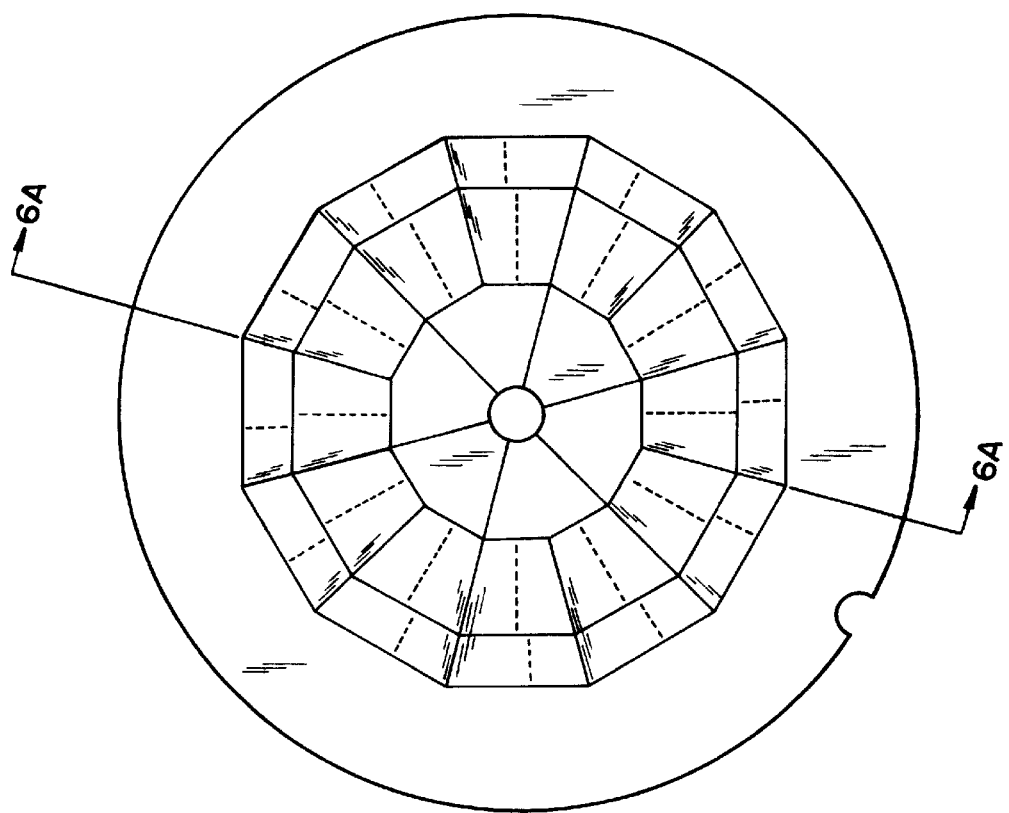

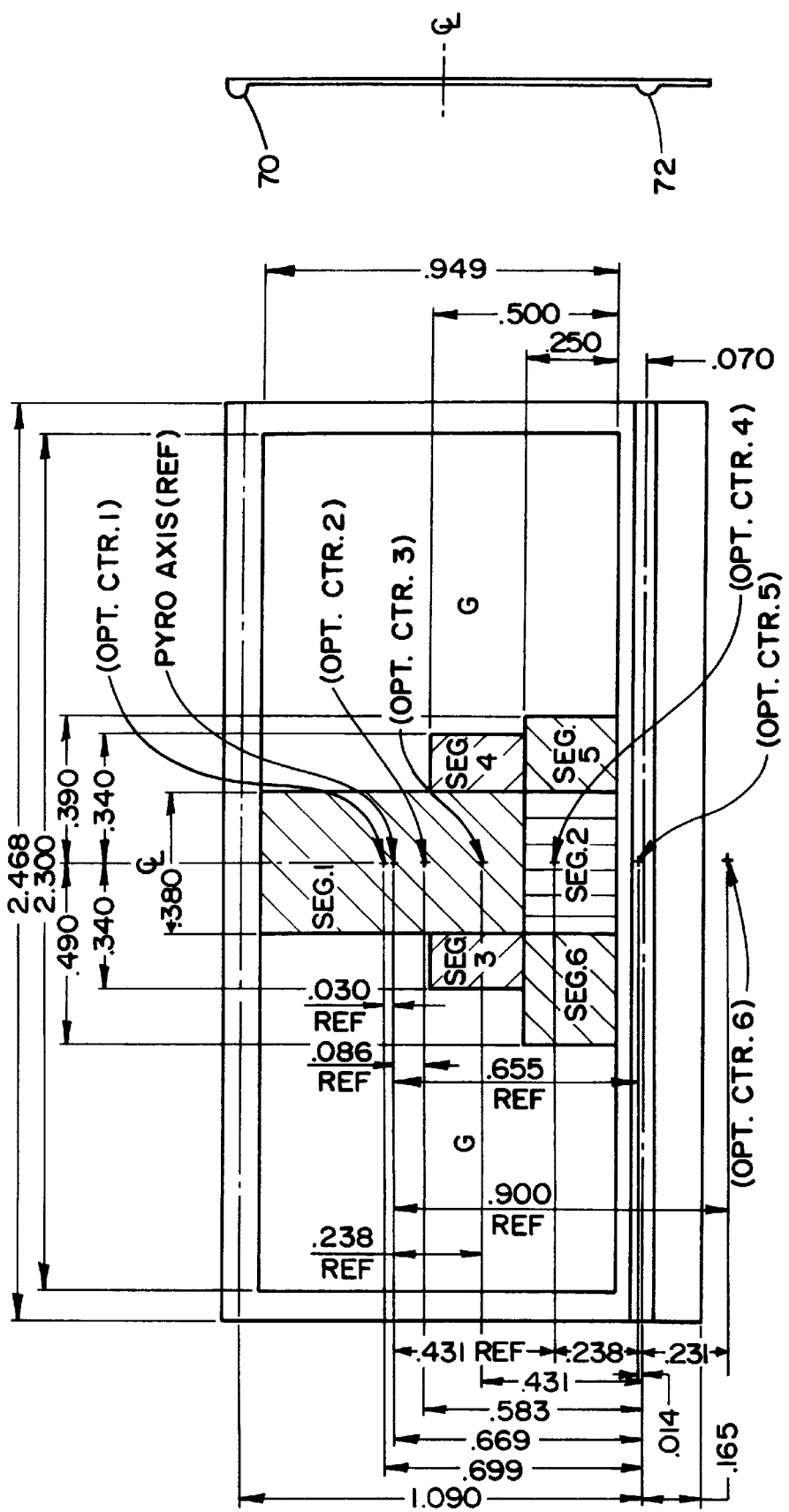

5,973,594

MULTIPLE OPTICAL DESIGNS FOR A MULTIFUNCTION SENSOR

This patent application is a continuation-in-part application of patent application Ser. No. 08/412,502, filed Mar. 29, 1995, now U.S. Pat. No. 5,699,243, for a Motion Sensing System With Adaptive Timing for Controlling Lighting Fixtures and of patent application Ser. No. (08/705,778), filed Aug. 30, 1996, which is now U.S. Pat. No. 5,772,326 for a Temperature and Passive Infrared Sensor Module.

BACKGROUND OF THE INVENTION

1. Field of the Invention

The present invention relates generally to multiple optical designs for a multifunction sensor, and more particularly pertains to multiple optical designs for a multifunction sensor as might be utilized in an occupied space networked environment such as an automated commercial or industrial building in which sensors are installed to sense and control various parameters therein. The sensors can include an occupancy sensor, such as a passive infrared (PIR) sensor or an active infrared sensor or an ultrasonic sensor, a temperature sensor, an ambient light sensor, a relative humidity sensor, a $CO_2$ sensor, a time of day sensor, and other parameter sensors.

It would be desirable to provide a plurality of such parameter sensors in one sensor module which can interface with one or more processor control systems to control operation of security systems, energy management control systems, etc. in the occupied space networked environment. Such processor control systems are available commercially which incorporate networking such as an Echelon LON-WORKS system, CEBus, BacNet, etc.

2. Discussion of the Prior Art

Traditionally, separate sensors have been used for occupancy sensing, ambient light sensing, temperature sensing, etc. in separate lighting control systems, Heating, Ventilation and Air Conditioning (HVAC) control systems, Demand Side Management (DSM) electrical load control systems, and security systems, although modules combining occupancy sensing and ambient light sensing have been used in nonnetworked systems.

SUMMARY OF THE INVENTION

Accordingly, it is a primary object of the present invention to provide multiple optical designs for a multifunction sensor as might be utilized in an occupied space networked environment such as an automated commercial or industrial building in which sensors are installed to sense and control various parameters therein.

In accordance with the teachings herein, the present invention provides a universal multifunction sensor and a method of providing a universal multifunction sensor having multiple optical designs and providing a plurality of parameter sensors in one sensor module which can interface with and control operation of one or more processor control systems in an occupied space networked environment. The universal multifunction sensor comprises a passive infrared occupancy sensor and an ambient light sensor. A common network communications and control processor coupled to a common communication transceiver are shared in common by the occupancy sensor and the ambient light sensor, such that the multifunction sensor can interface with and control operation of one or more processor control systems in an occupied space networked environment. A segmented lens array comprises a plurality of lens segments forming a lens array for directing infrared radiation onto the passive infrared occupancy sensor, and is selected from one of the group of segmented lens arrays comprising: a wide view wall-mount lens array providing both a wide field of view and both a long and short range detection optical pattern; a hallway wall mount lens array providing a narrow field of view and a long range detection optical pattern; a cubicle wall mount lens array providing a wide field of view and a very short range detection optical pattern; whereby the universal multifunction sensor can be provided with a segmented lens array designed to optimize the field of view and motion detection for a particular mounting application.

In greater detail, the group of segmented lens arrays further includes a ceiling mount lens array providing a 360° wide field of view and both a long and short range detection optical pattern. The plurality of parameter sensors can further include a temperature sensor. Moreover, the universal multifunction sensor can be mounted in one fixture selected from one of the group of fixtures comprising a wallmount fixture mounted flush upon a wall or in a corner, a ceiling mount fixture mounted flush upon a ceiling, or a wall switch fixture mounted recessed in a wall switch receptacle box mounted recessed in a wall.

The multifunction sensor can be connected in a multifunction network sensor system which further comprises energy management and security controller systems, and a common data communication network which connects to the multifunction sensor and the controller systems to form a local operating network in a building. Moreover, a plurality of the multifunction sensors are placed at different locations throughout the building.

The present invention also provides a cubicle wall mount segmented lens array providing a wide field of view and a very short range detection optical pattern suitable for operation in a close-in environment as in a cubicle, and yet having the same focal distance as a wideview or hallway sensor, to create a universal lens design for a universal multifunction sensor. The cubicle wall mount segmented lens comprises a curved Fresnel lens array comprising a plurality of Fresnel lens segments positioned along the length of the lens array, and atypically positioned out-of-focus with respect to an infrared detector element, each of the segments provides a field of view slightly below the horizon. A plurality of lensless infrared window segments are positioned near the bottom of the lens array, providing a short range detection optical pattern and field of view inclined substantially downwardly with respect to the field of view of the Fresnel lens array and the horizon.

In greater detail, each Fresnel Lens segment has a focal length of substantially 1.2 inches which is defocused by 0.3 inches with respect to the infrared detector element to provide a broader detection pattern which is beneficial for close-up detection. Moreover, the widths of the Fresnel lens segments vary from the centrally positioned lens segments which have the narrowest width to the peripheral end-most segments which have the widest width. The widths of the intermediate segments between the central segments and the end-most peripheral segments vary progressively from the narrow width of the central segments to the larger width of the peripheral segments. Moreover, the widths of the infrared window segments vary from the centrally positioned infrared window segments which have the narrowest width to the peripheral, end-most infrared window segments which have the widest width. The widths of the intermediate infrared window segments between the central infrared window segments and the end-most peripheral infrared window segments vary progressively from the narrow width of the central infrared window segments to the larger width of the peripheral infrared window segments. Each of the infrared window segments is dimensioned approximately 0.05 inches by 0.10 inches, and varies slightly as explained.

BRIEF DESCRIPTION OF THE DRAWINGS

The foregoing objects and advantages of the present invention for multiple optical designs for a multifunction sensor may be more readily understood by one skilled in the art with reference being had to the following detailed description of several preferred embodiments thereof, taken in conjunction with the accompanying drawings wherein like elements are designated by identical reference numerals throughout the several views, and in which:

FIGS. 5 and 6 illustrate commercially available lens designs for respectively a wide view lens and a ceiling mount lens which are suitable for use with a basic multifunction sensor;

FIG. 7 illustrates an optical design for a hallway lens array which is designed to operate with the same basic multifunction sensor;

DETAILED DESCRIPTION OF THE DRAWINGS

Figure 1:
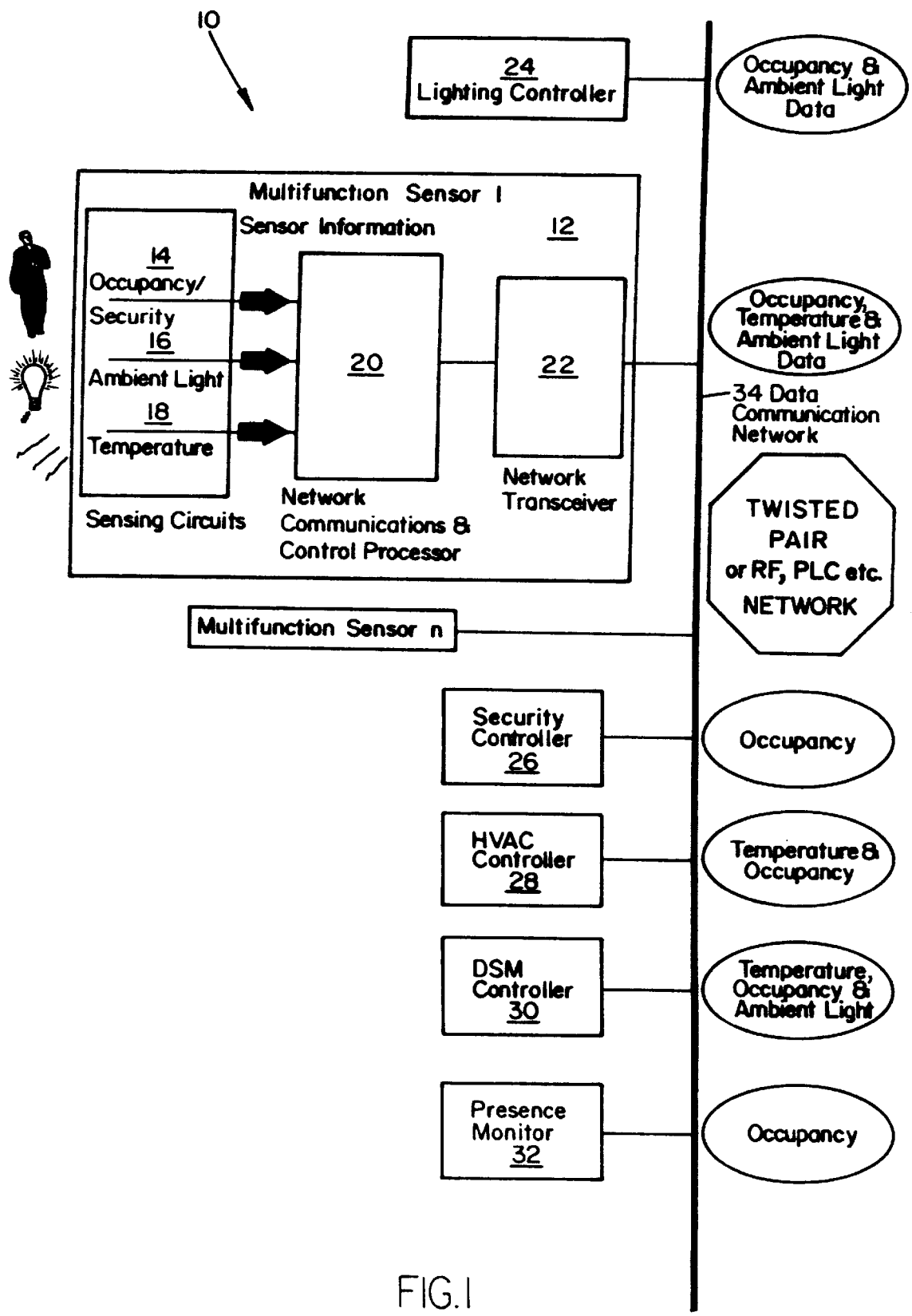
FIG. 1 is a block diagram of a multifunction network sensor system pursuant to the present invention which comprises multifunction sensors, each of which generally includes at least an occupancy sensor, a temperature sensor and an ambient light sensor, all of which share the same network communications and control processor and the same network communication transceiver, and a plurality of energy management and security controller systems, all of which are connected to a common data communication network.

Referring to the drawings in detail, FIG. 1 is a block diagram of a multifunction network sensor system 10 pursuant to the present invention which comprises multifunction sensors 12, each of which generally includes at least an occupancy sensor 14, an ambient light sensor 16, and a temperature sensor 18, all of which share the same network communications and control processor 20 and the same communication transceiver 22. The multifunction network sensor system 10 further comprises energy management and security controller systems 24, 26, 28, 30 and 32, and a common data communication network 34 which connects to all of the multifunction sensors and controller systems.

Different multifunction sensors 12 (1 to n) can be placed at various locations throughout a building, typically several on each floor level. The multifunction sensors are typically housed in small plastic enclosures such as those illustrated in FIGS. 2, 3 and 4. The occupancy (or motion) sensor 14 technology can be passive infrared (PIR), IR, ultrasonic, sonic, RF, microwave, radar or any other effective occupancy sensing technology. One preferred version is a Passive Infrared (PIR) design which can be used in hallways, rooms/offices or open office cubicles, each provided with a lens designed to optimize the field of view and motion detection for that particular application.

Each multifunction sensor 12 is assigned a unique location address, and is connected to the common data communication network 34 located throughout the building to form a local operating network. Each multifunction sensor 12 can transmit and receive data, including its own unique address, over the data communication network 34 on a continual periodic basis, such as every 5 seconds, respond when polled by an energy management or security controller.

The data communication network 34 is also accessed by control systems requiring data such as: one or more lighting controllers 24 which require data from one or more of the multifunction sensors 12 on occupancy and ambient light; one or more security controllers 26 which require data from one or more of the multifunction sensors 12 on occupancy or security intrusion; one or more HVAC controllers 28 which require data from one or more of the multifunction sensors 12 on occupancy and temperature; one or more DSM controllers 30 which require data from one or more of the multifunction sensors 12 on occupancy, temperature and ambient light; and one or more presence monitors 32 which require data from one or more of the multifunction sensors 12 on occupancy. The lighting, HVAC, DSM and security controllers can comprise one composite controller or individual controllers connected to the common data bus.

The data communication network 34 can use any suitable technology or physical transmission media such as twisted wire pair, power line carrier (PLC), RF, fiber optics, etc., and can employ any suitable common bus data communications protocol such as LONWORKS, CEBus, BacNet, etc.

Each multifunction sensor 12 will generally include sensors for detecting occupancy, ambient light level, and temperature, and can provide optimum cost/function design variations by using all three, any two, or any one of these three basic sensing functions, depending upon the user requirements/application. Each multifunction sensor can also include additional sensors for detecting time-of-day, relative humidity, $CO_2$ and other parameters. However, it should be noted that the mounting and exposure requirements of the diverse parameter sensors in one sensor module are often quite different, such that it is sometimes difficult to mount the diverse sensors in a common sensor module. For instance, a temperature sensor should be mounted to be exposed to a flow of air from the environment of a room being monitored, while a passive infrared occupancy sensor should be mounted so as not to be exposed to a flow of air from the environment of the room being monitored. The temperature sensor should also be insulated or shielded from direct exposure to and heat loading from sunlight. patent application Ser. No. (docket 10255), filed Aug. 30, 1996, discloses and teaches compatible mounting arrangements for a temperature sensor and a passive infrared sensor.

The present invention can use a passive infrared (PIR) sensor such as pyro sensor model no. RE03HBBEC, manufactured by Nippon Ceramic Co., Ltd. of Japan, which detects electromagnetic radiation in the range of 8 to 14 microns. The pyro sensor can be connected to an amplifier such as a dual op-amp circuit model no. TLC27L2CD manufactured by Texas Instruments Inc. of Dallas, Tex.

A preferred form of the multifunction passive infrared occupancy sensor is described in detail in copending patent application Ser. No. (docket 10348), for Multifunction Occupancy Sensor, filed on Oct. 25, 1996, the entire disclosure of which is hereby expressly incorporated by reference herein.

Figure 2:
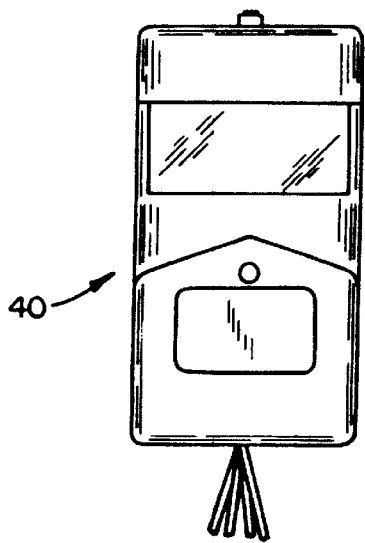
FIGS. 2, 3 and 4 illustrate three different types of multifunction sensors pursuant to the present invention, a wall-mount multifunction sensor, a ceiling mount multifunction sensor, and a wall switch multifunction sensor, each of which could be utilized in the multifunction network sensor system of FIG. 1.
Figure 2A:
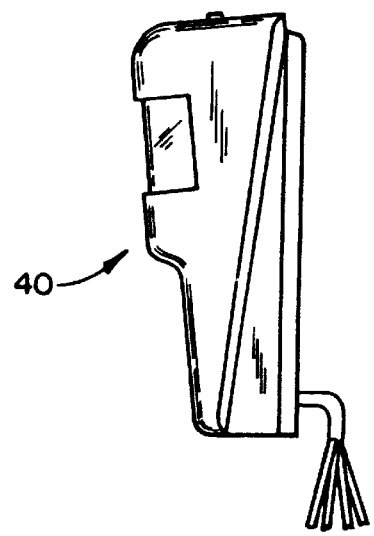
Figure 3:
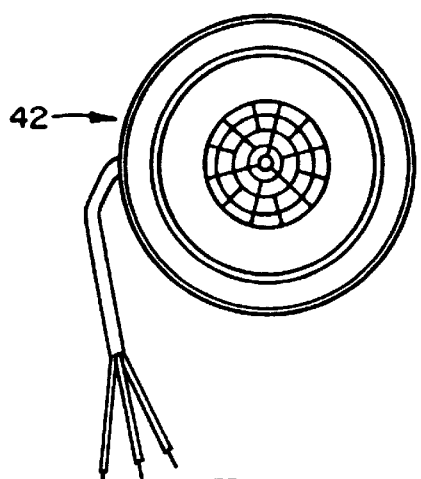
Figure 3A:
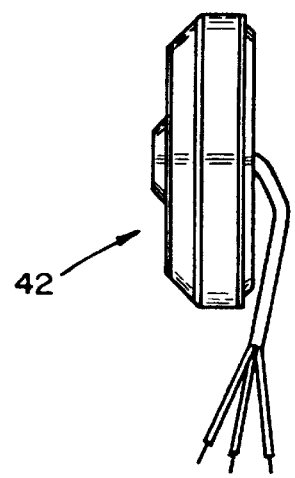
Figure 4:
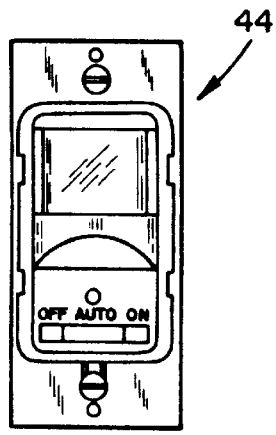
Figure 4A:
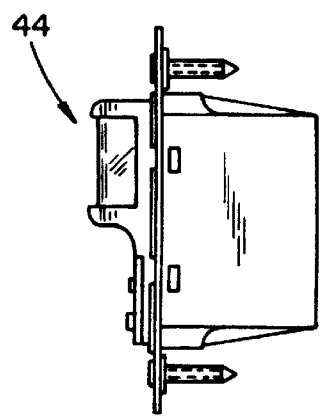

FIGS. 2, 3 and 4 illustrate three different types of multifunction sensors pursuant to the present invention, a wallmount multifunction sensor 40, a ceiling mount multifunction sensor 42, and a wall switch multifunction sensor 44, each of which could be utilized in the multifunction network sensor system of FIG. 1. The wallmount multifunction sensor 40 is similar to the wall switch multifunction sensor 44, except that the wall switch multifunction sensor 44 mounts recessed in a wall switch receptacle box rather than flush upon a wall. The ceiling mount multifunction sensor 42 is similar to units 40 and 44 electrically, but generally will not include a temperature sensor and a front press switch, as shown in FIG. 4.

The multifunction sensor and network sensor system are described in detail in copending patent application Ser. No., (docket 10343), for Multifunction Sensor and Network Sensor System, filed on Oct. 25, 1996, the entire disclosure of which is hereby expressly incorporated by reference herein.

It would be highly advantageous and cost effective for a single multifunction sensor to be able to operate and function in a variety of different environments and applications with only a lens array change. For example, a single universal multifunction wall mounted sensor could be fitted with interchangeable lenses for three different applications, i.e. wide view, hallway and cubicle. Such a single universal multifunction sensor would be very valuable to a multifunction sensor manufacturer.

Figure 8:
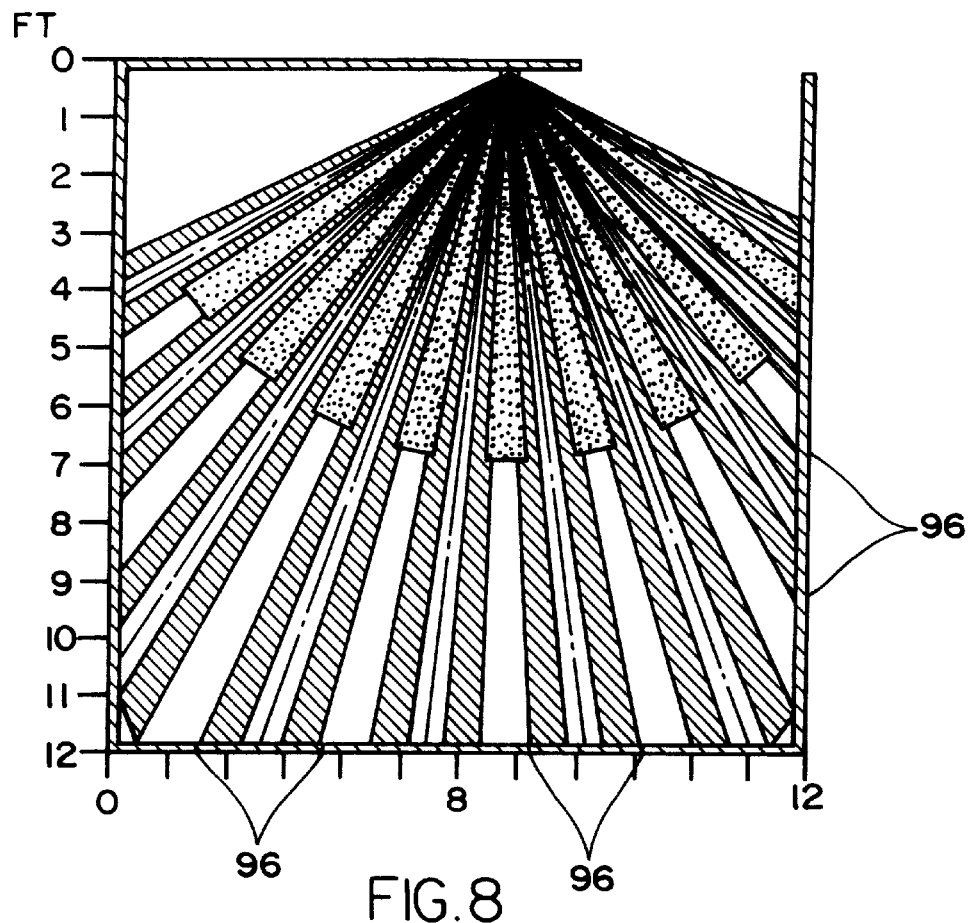
FIGS. 8 and 9 are respectively field of view diagrams and an optical design for a cubicle lens designed to operate with the same basic universal multifunction sensor.
Figure 9:
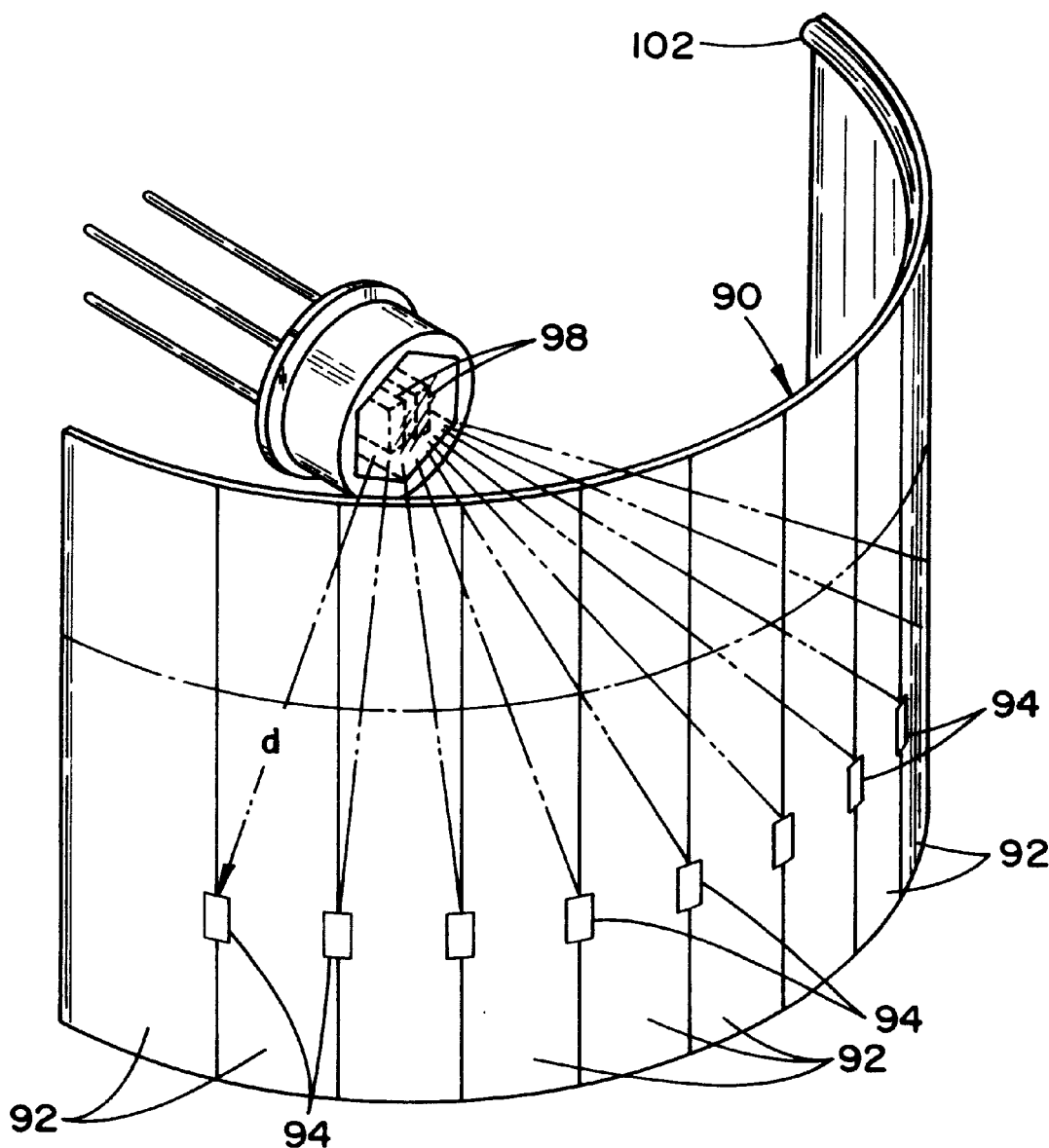

FIGS. 5, 6, 7 and 9 illustrate different embodiments of segmented lens array which can be used with the various mounting housings shown in FIGS. 2 through 4. FIGS. 5, 7, 8 and 9 illustrate alternative lens designs which are suitable for wallmount fixtures, while FIG. 6 illustrates a lens suitable for a ceiling mount fixture. The segmented lens arrays of FIGS. 5, 7 and 9 are suitable for a wallmount unit, and all of these lens designs are curved, as best illustrated in the lens embodiment of FIG. 9, and are designed to be interchangeably mounted in a wallmount unit as illustrated in FIGS. 2 and 4.

FIGS. 5 and 6 illustrate commercially available lens designs for respectively a wide view lens and a ceiling mount lens which are suitable for use with a basic multifunction sensor.

The wide view segmented lens array of FIG. 5 is curved as described hereinabove to give a panoramic view of a wide view surrounding the multifunction sensor housing, and is a Fresnel type of lens which has a relatively flat cross section as illustrated in FIG. 5A. Moreover as illustrated in FIG. 5A, the lens includes upper and lower mounting beads 50 and 52 which extend along the curved length of the lens element, and are utilized to properly position and mount the lens within the wallmount unit, and to provent the lens from being pushed in from the front. Moreover, the beads also function as tracks to enable the angular position of the curved lens elements to be angularly shifted and changed relative to the multifunction sensor housing to adjust the angular field of view of the multifunction sensor.

The segmented lens array includes lens segments 1 through 13 positioned along the curved length of the lens to give the sensor a wide angle view of the surrounding environment. Lens segments 14 through 19 are positioned below the central portion of lens segments 3 through 11, and offer an intermediate downwardly sloped view of the surrounding environment. Likewise, lens segments 20–22 are positioned below lens segments 14–19, and offer a steep downward view of the surrounding environment. This general type of lens array is available commercially from Fresnel Technologies, without the specific mounting beads and dimensions of the curvature and configuration, as model WA 0.9 G1, and accordingly, the details of the various lens segments 1–22 will not be described in detail herein.

FIGS. 6 and 6A illustrate a ceiling mount lens array suitable for use in the ceiling mount fixture of FIG. 3. This ceiling mount lens array is available commercially from Fresnel Technologies as model CM 0.77 G1 V2, and accordingly will not be described in detail herein. The ceiling mount lens array of FIG. 6 is not interchangeable with the wallmount lens arrays illustrated in FIGS. 5, 7, 8 and 9. However, the electronic design of the multifunction sensor, as shown in FIG. 1, is interchangeable, with minor exceptions with the electronic design of the wallmount units. The electronic design of the multifunction sensor is described in detail in copending patent application docket (10343).

FIG. 7 illustrates an optical design for a hallway lens array which is designed to operate with the same basic multifunction sensor. The following analysis was pertinent to developing the optical design of the hallway lens array.

Fresnel lenses are most efficient when they are flat; wide view lens arrays approximate this by utilizing narrow vertical flat segments arranged along a curve, typically a radius. A hallway lens requires narrow fields of view with long focal length lens segments. Typical wide view lens arrays have shorter focal length lens segments with wider fields of view. A hallway lens array requires much larger lens segment areas to collect energy; narrow segments do not provide sufficient collection area. Great efforts are made to provide flat lens segments for long range for hallway lens arrays, e.g. enclosure modifications resulting in flat surfaces for the lens arrays, wide as well as high segment areas, etc.

The wall mount sensor utilizes a hallway lens which is interchangeable with the wide view lens array and the cubicle lens array. This approach presents several advantages. It permits common enclosure parts as well as common electronic circuit board assemblies for both wall mount sensors, i.e. the wide view sensor and the hallway sensor. The hallway lens operates on a curve (0.9 inch radius), which is the same curve as the wide view lens array and the cubicle lens array, making it factory or field interchangeable with the wide view lens array and the cubicle lens array. Through experimentation with curved Fresnel optics, it was discovered that a lens segment width which extends beyond approximately ⅓ of the available lens radius, can suffer significant signal cancellation effects. Hence with movement detected in the optical field of view of a symmetrical optical segment wider than ⅓ of the available lens diameter, the resulting ersatz signal from the analog electronics can be greatly diminished in amplitude when compared to a flat optical segment. Thus, for a given lens array curvature, an optimal and maximum segment width can be determined.

In addition, it was discovered that locating segments (horizontally) more than a distance approximately equal to ¼ of the focal distance, along the lens curvature from the vertical centerline of the lens array, results in a significant shift in azimuth from what is expected with a flat lens array. Attempts to compensate by adjusting the optical center suffer from increased inefficiencies. This becomes critical for long range hallway lens segments. The hallway lens array provides excellent range with a curved lens array, by adhering to a design which locates only shorter range segments (horizontally) beyond ¼ of the focal distance, minimizing the effects of azimuth shift.

Using both of the above scientific principles, a curved hallway lens was designed using short (0.9 inch) focal length segments, for sensor detection ranges measured in excess of 80 feet.

FIG. 7 illustrates the designed hallway lens, which has a long range, narrow field of view, such that it is suitable to be positioned at the end of a hallway, and is the subject of patent application No. 08/758,888 filed Dec. 2, 1996 and is now U.S. Pat. No. 5,877,499. The lens array of FIG. 7 is also a Fresnel type of lens, and includes mounting beads 70 and 72 extending along the curved length thereof, which are utilized to mount and properly position the lens array within a sensor housing, and to prevent the lens from being pushed in from the front. The lens segments 1–6 in FIG. 7 are shaded to more definitely illustrate the extent of their area, and the optical centers of each Fresnel lens segment is also illustrated in FIG. 7, along with the specific dimensions of each of the segments. Lens array segments 1, 2, 3 and 4 all have a 0.9 inch focal length. Lens array segments 5 and 6 have a 1.2 inch focal length. The nonshaded areas G outside of the lens segments 1–6 have a negative focal length, and form inactive areas of the lens array, and do not participate in the occupancy sensor function. The hallway lens of FIG. 7 is curved, in a manner as best illustrated by the lens array of FIG. 9, and is interchangeable with the lens arrays of FIGS. 5 and 9 in a universal sensor housing. The lens array segment 1 offers a view of the center field of view, while the lens array segments 2 through 6 provide fields of view positioned at increasingly larger declination angles relative to segment 1, as the segment numbers increase (because of the positioning of the optical center of the segments as shown in FIG. 7. The two optical segments 5 and 6 with the greatest declination use a longer focal length to optimize sensitivity.

The optical design of a cubicle lens array is the opposite extreme from a hallway lens. The hallway lens requires very long focal lengths for optimal performance, whereas the cubicle lens requires very short focal lengths for optimal performance.

A universal sensor can be created by designing a cubicle lens with the same focal distance as a wideview/hallway sensor. This lens design can be accomplished by using an array of Fresnel lens segments with a judicious balance between the number of lens segments in the useable aperture and the sizes of the lens segments, and further by using an array of unlensed apertures or infrared windows in the lens array. The Fresnel lens segments are atypically positioned (out of focus) with respect to the pyrodetector of the PIR sensor.

FIGS. 8 and 9 are respectively field of view diagrams and an optical design for a cubicle lens designed to operate with the same basic universal wallmount multifunction sensor. FIG. 9 illustrates a curved Fresnel lens array 90 suitable for operation in a cubicle type of environment. As mentioned hereinabove, this lens array 90 design includes an array of Fresnel lens segments 92, and an array of infrared windows (without optical power) 94 providing for very short range detection and a field view inclined substantially downwardly with respect to the horizon and the field of view provided by the array of Fresnel lens segments.

Figure 8A:
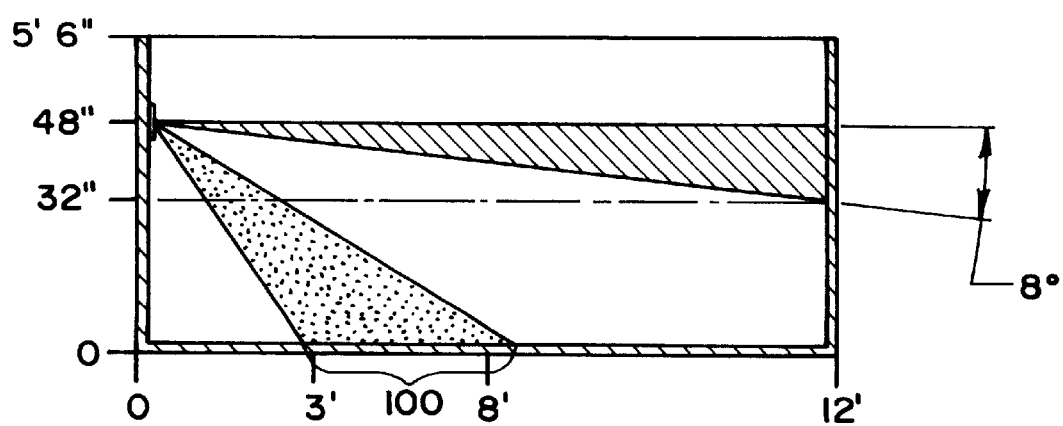

FIGS. 8 and 8A illustrate respectively a horizontal plan view and a vertical elevational view of the fields of view provided by the Fresnel lens segments 92 and the infrared window segments 94 shown in FIG. 9.

As illustrated in FIG. 9, the curved lens array includes a plurality of Fresnel lens segments 92 positioned along the length of the curved array, each of which offers the field of view illustrated by one set of diagonal striped lines 96 in FIGS. 8 and 8A. Each of the Fresnel lens segments 92 has a focal length which is 0.3 inches different (can be larger or smaller in alternative embodiments) from the focal distance at which it is used (in FIG. 9, the distance d from the lens array 90 to the central sensing element 98). For instance in this particular embodiment, with a distance d of 0.9 inches, a focal length of 1.2 inches is selected, which is substantially defocused with respect to the pyroelectric detector element 98. The defocusing offers a broader detection pattern which is better for close-up detection. The lens segments 92 are not of uniform width. The width of the central segment(s) is the narrowest. The width of the two end-most or peripheral segments is the widest. The widths of the intermediate segments between the central segment(s) and the end-most peripheral segments vary progressily from the narrow width of the central segment(s) to the larger width of the peripheral segments. This basically compensates for off-axis signal loss by designing the off-axis lens segments to be progressively larger as they are positioned further off-axis from the central axis.

The lower field of view segments 100 illustrated in black in FIGS. 8 and 8A are provided by the number of lensless (no optical power) segments or IR windows 94 positioned near the bottom of the lens array, with each lensless segment positioned along the circumferential length of the array with differing spacings between the lensless segments i.e. they are spaced to provide a minimum void size between fields of view which decrease in angular divergence as the windows move off the centerline, for a given window size. Each of the lensless segments or IR windows 20 is dimensioned approximately 0.05 by 1.10 inches, with the dimensions varying slightly as described.

The cubicle lens array illustrated in FIG. 9 also has upper and lower mounting beads 102, to be interchangeably mounted in a universal sensor housing with the lens elements of FIGS. 5 and 7.

While several embodiments and variations of the present invention for multiple optical designs for a multifunction sensor are described in detail herein, it should be apparent that the disclosure and teachings of the present invention will suggest many alternative designs to those skilled in the art.

What is claimed is:

1. A universal multifunction sensor having multiple optical designs and providing a plurality of parameter sensors in one sensor module which can interface with and control operation of one or more processor control systems in an occupied space networked environment, comprising:

a. a passive infrared occupancy sensor;
   b. an ambient light sensor;
   c. a common network communications and control processor coupled to a common communication transceiver which are shared in common by the occupancy sensor and the ambient light sensor, such that the multifunction sensor can interface with and control operation of one or more processor control systems in an occupied space networked environment; and
   d. a segmented lens array comprising a plurality of lens segments forming a lens array for directing infrared radiation onto the passive infrared occupancy sensor, selected from one of the group of segmented lens arrays comprising: a wide view wall mount lens array providing both a wide field of view and both a long and short range detection optical pattern; a hallway wall mount lens array providing a narrow field of view and a long range detection optical pattern; a cubicle wall mount lens array providing a wide field of view and a very short range detection optical pattern; whereby the universal multifunction sensor can be provided with a segmented lens array designed to optimize the field of view and motion detection for a particular mounting application.

2. A universal multifunction sensor as claimed in claim 1, wherein the group of segmented lens arrays further includes a ceiling mount lens array providing a 360° wide field of view and both a long and short range detection optical pattern.

3. A universal multifunction sensor as claimed in claim 1, wherein the plurality of parameter sensors further includes a temperature sensor.

4. A multifunction sensor as claimed in claim 1, wherein the universal multifunction sensor can be mounted in one fixture selected from one of the group of fixtures comprising a wallmount fixture mounted flush upon a wall or in a corner, a ceiling mount fixture mounted flush upon a ceiling, or a wall switch fixture mounted recessed in a wall switch receptacle box mounted recessed in a wall.

5. A universal multifunction sensor as claimed in claim 1, connected in a multifunction network sensor system which further comprises energy management and security controller systems, and a common data communication network which connects to the multifunction sensor and the controller systems to form a local operating network in a building.

6. A universal multifunction sensor as claimed in claim 5, further including a plurality of said multifunction sensors which are placed at different locations throughout the building.

7. A method of providing a universal multifunction sensor with multiple optical designs, wherein the universal multifunction sensor comprises a plurality of parameter sensors in one sensor module which can interface with and control operation of one or more processor control systems in an occupied space networked environment, comprising:

a. providing a universal multifunction module with a passive infrared occupancy sensor, an ambient light sensor, and a common network communications and control processor coupled to a common communication transceiver which are shared in common by the occupancy sensor and the ambient light sensor, such that the multifunction sensor can interface with and control operation of one or more processor control systems in an occupied space networked environment; and b. selecting a segmented lens array, comprising a plurality of lens segments forming a lens array for directing infrared radiation onto the passive infrared occupancy sensor, selected from one of the group of segmented lens arrays comprising: a wide view wall mount lens array providing both a wide field of view and both a long and short range optical detection pattern; a hallway wall mount lens array providing a narrow field of view and a long range optical detection pattern; and a cubicle wall mount lens array providing a wide field of view and a very short range optical detection optical pattern.

8. A method of providing a universal multifunction sensor as claimed in claim 7, wherein the selection group of segmented lens arrays further includes a ceiling mount lens array providing a 360° wide field of view and both a long and short range detection optical pattern.

9. A method of providing a universal sensor as claimed in claim 7, further including providing a temperature sensor.

10. A method of providing a universal multifunction sensor as claimed in claim 7, further including mounting the universal multifunction sensor in one of a group of fixtures selected from the group comprising a wallmount fixture mounted flush upon a wall or in a corner, a ceiling mount fixture mounted flush upon a ceiling, or a wall switch fixture mounted recessed in a wall switch receptacle box mounted recessed in a wall.

11. A method of providing a universal multifunction sensor as claimed in claim 7, further including connecting the universal multifunction sensor in a multifunction network sensor system which further comprises energy management and security controller systems, and a common data communication network which connects to the multifunction sensor and the controller systems to form a local operating network in a building.

12. A method of providing a universal multifunction sensor as claimed in claim 11, further including placing a plurality of said multifunction sensors at different locations throughout the building.

* * * * *